United States Patent

Yamasaki et al.

[11] Patent Number: 6,132,592
[45] Date of Patent: Oct. 17, 2000

[54] METHOD OF ETCHING NON-DOPED POLYSILICON

[75] Inventors: Shinya Yamasaki; Hidemitsu Aoki; Yasushi Sasaki, all of Tokyo, Japan

[73] Assignee: NEC Corporation, Tokyo, Japan

[21] Appl. No.: 09/281,475

[22] Filed: Mar. 30, 1999

[30] Foreign Application Priority Data

Mar. 30, 1998 [JP] Japan ................................. 10-084105

[51] Int. Cl.[7] .................................................. H01L 21/00
[52] U.S. Cl. ...................... 205/640; 205/674; 438/745; 438/753
[58] Field of Search ..................................... 438/745, 751, 438/753, 756, 757; 205/640, 656, 660, 674

[56] References Cited

U.S. PATENT DOCUMENTS

| | | |
|---|---|---|
| 2,998,362 | 8/1961 | Hall .......................................... 438/753 |
| 3,730,800 | 5/1973 | Nakashima ............................... 438/752 |

*Primary Examiner*—William Powell
*Attorney, Agent, or Firm*—Scully, Scott, Murphy & Presser

[57] ABSTRACT

A semiconductor device having a non-doped polysilicon and a doped polysilicon containing group III element is selectively wet-etched the non-doped polysilicon by using an etching liquid. The etching liquid is an electrolytic liquid obtained on a side of a cathode electrode and the electrolytic liquid is formed by electrolyzing a liquid containing pure water added with ammonium ion.

15 Claims, 7 Drawing Sheets

METHOD OF ETCHING NON-DOPED POLYSILICON

BACKGROUND OF THE INVENTION

1. Field of the Invention

The present invention relates to a fabrication method of a semiconductor device and, particularly, to a method of selectively etching non-doped polysilicon in a semiconductor device having doped polysilicon and non-doped polysilicon.

2. Description of Related Art

In the fabrication of a semiconductor device such as bipolar transistor, the etching step has been important and indispensable in forming a desired pattern.

For example, in case that a semiconductor device includes a non-doped polysilicon film and a doped polysilicon film, for example, boron-doped polysilicon, there is situation to need to remove selectively the non-doped polysilicon film. Such a situation is performed a wet etching by using a etching liquid.

In the wet-etching step of polysilicon mentioned above, in order to perform an anisotropic etching utilizing a selection ratio between the boron-doped polysilicon film and the non-doped polysilicon film, the etching selection ratio must be high. In order to obtain such high etching selection ratio, it has been usual to use hydrazine which has high alkalinity (pH=12~14) and has high reducing capability. However, since the use of hydrazine was inhibited due to its adverse effect to the human body and the ecological system (cause of variability and malformation) and, nowadays, TMAH (tetramethylammonium hydroxide) is used as an etching liquid instead of hydrazine.

Hoever, TMAH can not etch non-doped polysilicon with selectivity as high as that of hydrazine. Further, since the use of TMAH may result in an increase of TOC (Total Organic Concentration), a considerable cost is required for the waste liquid processing due to the recent restriction of the reference value of drain water.

SUMMARY OF THE INVENTION

Therefore, an object of the present invention is to provide a fabrication method of a semiconductor device, which uses an etching liquid which can etch a non-doped polysilicon at a selection ratio as high as that of hydrazine and does not raise any environmental problem.

As a result of analysis of the above mentioned problem, the inventors of the present invention have found that it is possible to etch non-doped polysilicon at a selection ratio as high as that of hydrazine by using a cathode water produced by electrolysis, particularly, a cathode side water obtained on the side of cathode by electrolyzing pure water added with ammonium ions, as an etching liquid. Further, when the cathode side water does not contain organic substance, the cathodic water does not raise any environmental problem and is superior as a substitution for the conventional etching liquid.

That is, a method of removing a non-doped polysilicon of the present invention comprises:

forming a non-doped polysilicon film and removing the non-doped polysilicon film by using an etching liquid, the etching liquid being an electrolytic liquid obtained on a side of a cathode electrode, the electrolytic liquid being formed by electrolyzing a liquid containing pure water added with ammonium ion.

BRIEF DESCRIPTION OF THE DRAWINGS

The above and other objects, advantages and features of the present invention will be apparent from the following description taken in conjunction with the accompanying drawings, in which.

DETAILED DESCRIPTION OF THE PREFERRED EMBODIMENTS

Figure 7:
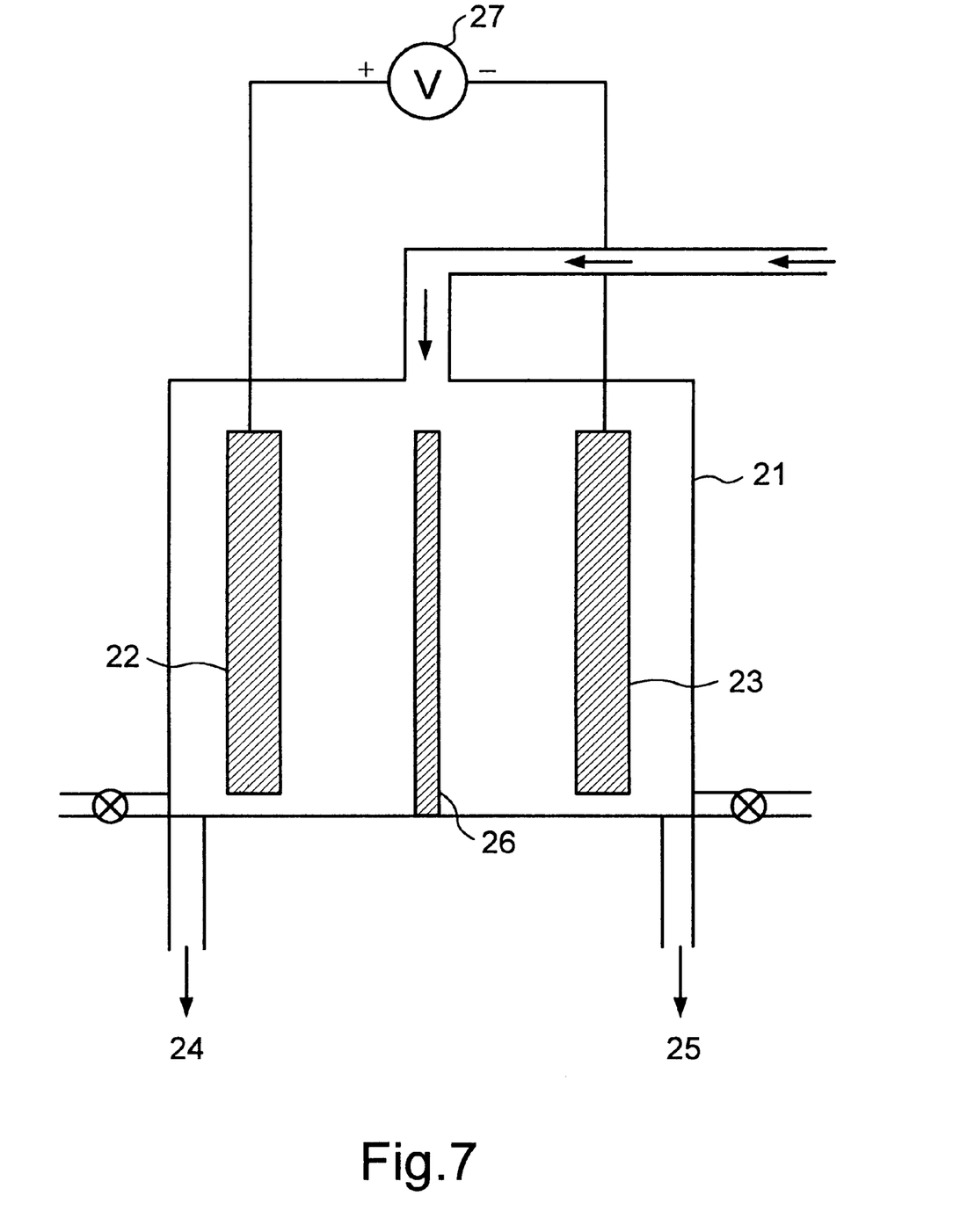
FIG. 7 shows an example of an electrolysis device for producing cathodic water to be used in the present invention.

First, a method for producing an electrolytic liquid will be described. As an electrolytic liquid producing device, there are two types, the double layer electrolysis type which is generally used and the triple layer electrolysis type which can electrolyze even pure water, as disclosed in, for example, Electrochemical Handbook, Version 4, pp. 244, 1985. The double layer electrolysis type electrolyzing liquid producing device will be described with reference to a conceptional construction thereof shown in FIG. 7. In FIG. 7, pure water added with ammonia ions in a predetermined concentration is supplied from a pure water storage tank (not shown) to an electrolytic tank 21. An anode 22 and a cathode 23 are inserted into the electrolytic tank 21 and separated by a fluoric ion exchange film 26 (cation film) provided therebetween for forming a pair of electrolysis chambers. A distance between the anode 22 in one of the electrolysis chambers and the cathode 23 in the other electrolysis chamber is 1 cm or less and a d.c. voltage is applied between these electrodes by a d.c. power source 27.

In the double layer electrolysis system used in this invention, the electrolytic tank 21 is divided by the ion exchange film 26 to the two electrolytic chambers as mentioned above and the electrodes arranged in the respective electrolytic chambers are of Pt which is not chemically reactive with the electrolytic liquid. The material of these electrodes is not limited to Pt. For example, carbon, particularly, glassy carbon, or $RuO_2$ may be used therefor. Further, it is unnecessary to use the same material for both the anode and cathode. For example, it is possible to use Pt as the material of the anode 22 which is immersed in acidic solution and to use carbon as the material of the cathode 23 which is immersed in alkaline solution.

Cathodic water is obtained by applying, between the anode 22 and the cathode 23, a d.c. voltage having a value high enough to produce hydrogen on the side of the cathode 23 and oxygen on the side of the anode and deriving hydrogen and oxygen from the chambers partitioned by the ion exchange film 26, separately. In this case, although the d.c. voltage value depends upon the concentration of ammonium ion added to pure water or the initial electrolysis condition, it may be in a range from 2V to 50V.

When electrolysis is started, $H^+$ ions are attracted to the cathode 23 and receive electrons from the cathode 23 and resultant $H_2$ gas is discharged. Since, therefore, $OH^-$ ions reside correspondingly in number to the reduction of $H^+$ ions, electrolytic water 25 on the side of the cathode 23 becomes alkalinity and reducible due to presence of hydrogen which is active radical produced around the cathode 23.

The concentration of ammonium ion in the electrolytic liquid may be suitably regulated such that an optimal etching rate and an optimal etching selectivity are obtained, and it is possible to obtain a practically usable etching liquid with the concentration of ammonium ion of 10% or less.

In order to add ammonium ions to pure water, aqua ammonia or ammonium salt can be used. Ammonium salt may include ammonium chloride, ammonium acetate, ammonium fluoride, ammonium nitride, ammonium bromide, ammonium sulphate, ammonium oxalate, ammonium carbonate, ammonium citrate acid, ammonium formic acid, etc. Among them, inorganic ammonium salt is preferable in view of TOC. Above all, aqua ammonia is particularly preferable. It should be noted that electrolytic liquid for use in a wet process of a semiconductor which should be protected against metallic pollution does not contain metal ion such as Na, K, Ca, etc., which adversely affect semiconductor elements.

In the present invention, the etching liquid which can be used in an etching which requires the selection ratio between doped polysilicon containing the group III element as impurity and non-doped polysilicon is obtained. The etching liquid according to the present invention provides a higher selection ratio when the dopant impurity is boron.

Although the cathode side water may be used as it is in an etching operation, it is preferable to heat it to a temperature, for example, 70° C. At about 50° C., a high selection ratio is obtained. However, when it exceeds 70° C., hydrogen in the cathode side water may be evaporated, causing the cathode side water to be unsuitable for the etching liquid.

Now, the present invention will be described in detail with reference to preferred embodiments. It should be noted, however, that the present invention is not limited thereto.

A liquid containing pure water added with ammonia was electrolyzed by the electrolysis device shown in FIG. 7 such that oxidation-reduction potential (ORP) of a resultant cathode side water becomes −810 mV (vs. NHE (normal hydrogen electrode) potential, while changing the concentration of ammonia in a range from 0.01% to 10% and the etching rates [Å/m] of the thus obtained cathode side water for non-doped polysilicon, a silicon substrate and boron-doped polysilicon (amount of dopant: $5\times10^{19}$ cm$^{-3}$) were measured at room temperature (24° C.). Results are shown in FIG. 4.

Figure 4:
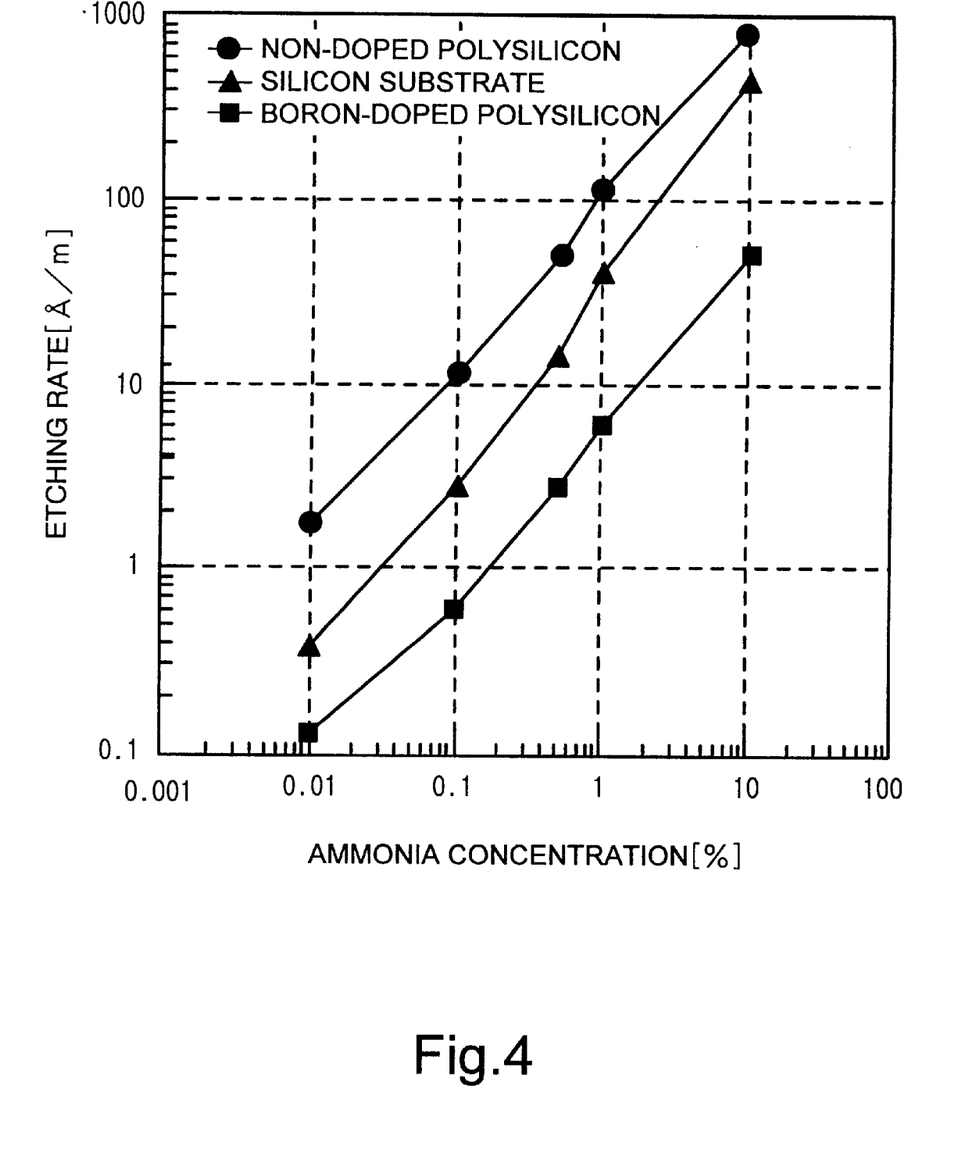
FIG. 4 is a graph showing etching rates of respective materials with respect to ammonia concentration.

As will be clear from FIG. 4, the etching rates for the respective materials are increased with increase of the ammonia concentration.

Figure 5:
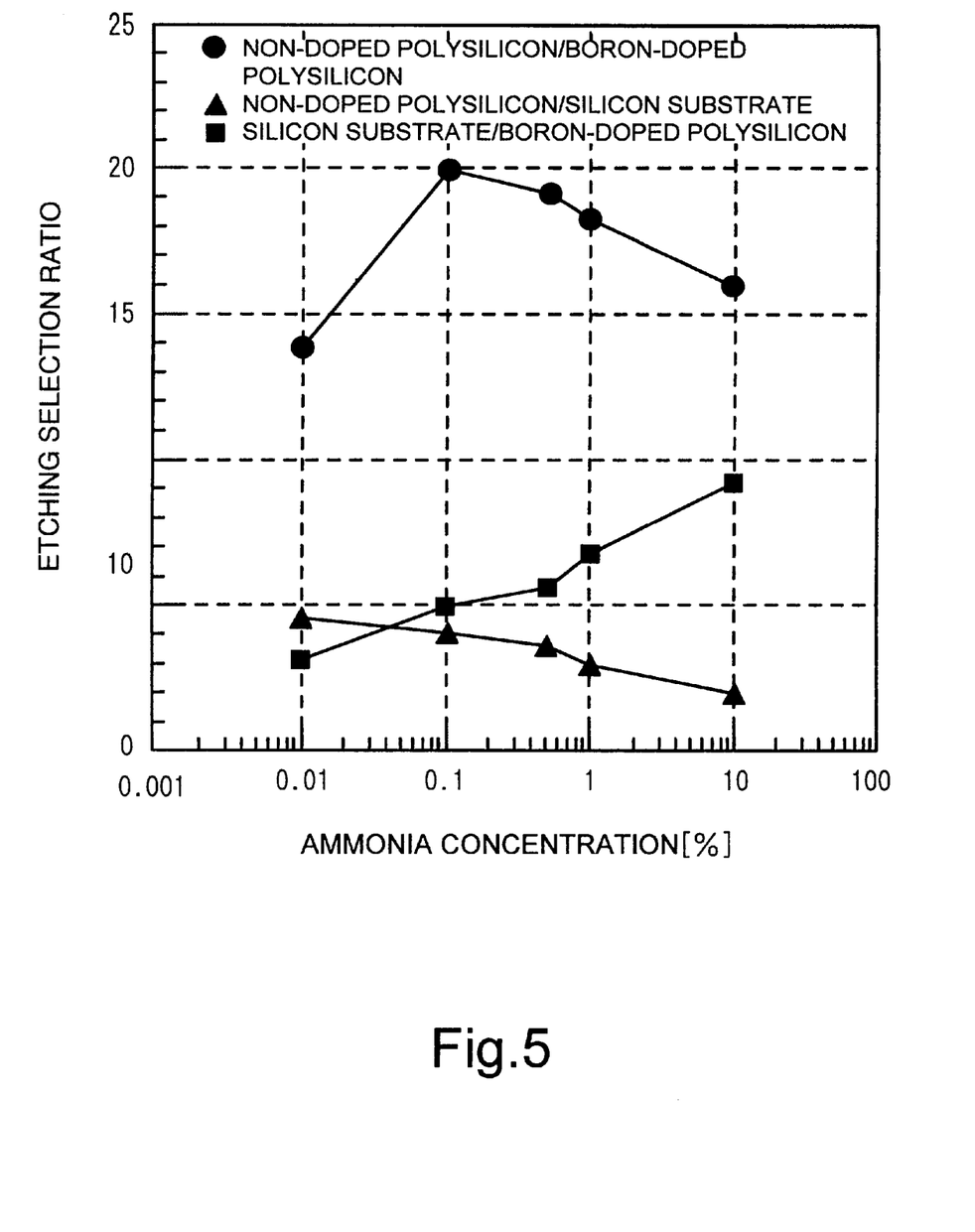
FIG. 5 is a graph showing a relation between the etching selection ratio between respective materials and the ammonia concentration.

Thereafter, the etching selection ratio between the respective materials was studied. FIG. 5 shows the etching selection ratios between non-doped polysilicon and boron-doped polysilicon, between non-doped polysilicon and the silicon substrate and between the silicon substrate and boron-doped polysilicon. As will be clear from FIG. 5, a high etching selection ratio is obtained between non-doped polysilicon and boron-doped polysilicon.

Figure 6:
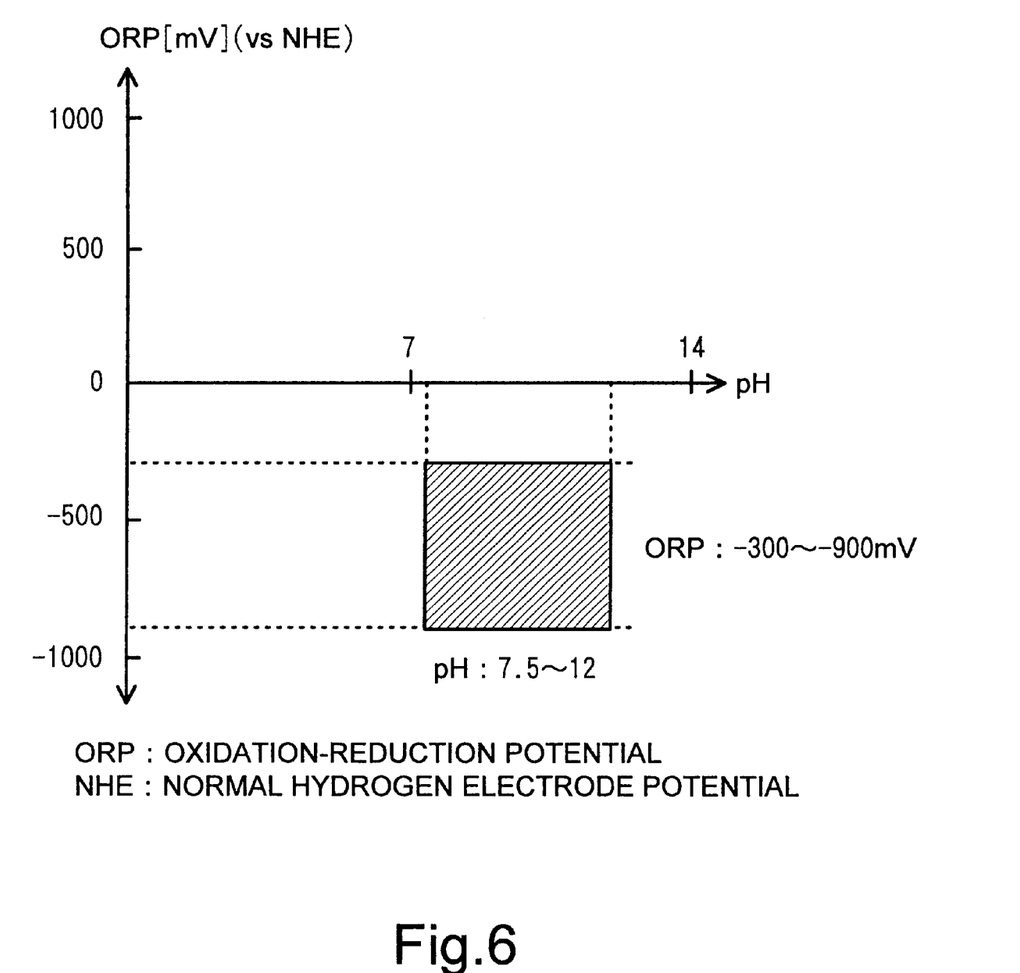
FIG. 6 is a graph showing optimal ranges of pH and ORP.

The optimal range of pH and the optimal range of ORP in the previously mentioned range of ammonia concentration were studied and it has been found that a hatched area in FIG. 6, that is, the pH range from 7.5 to 12 and the ORP range from −300 to −900 mV are preferable in relation to the etching selection ratio. In electrolytic water, the oxidation-reduction potential and pH are correlated to each other and pH of 7.5 substantially corresponds to oxidation-reduction potential of −300 mV and pH of 12 substantially corresponds to oxidation-reduction potential of −900 mV.

Figure 2:
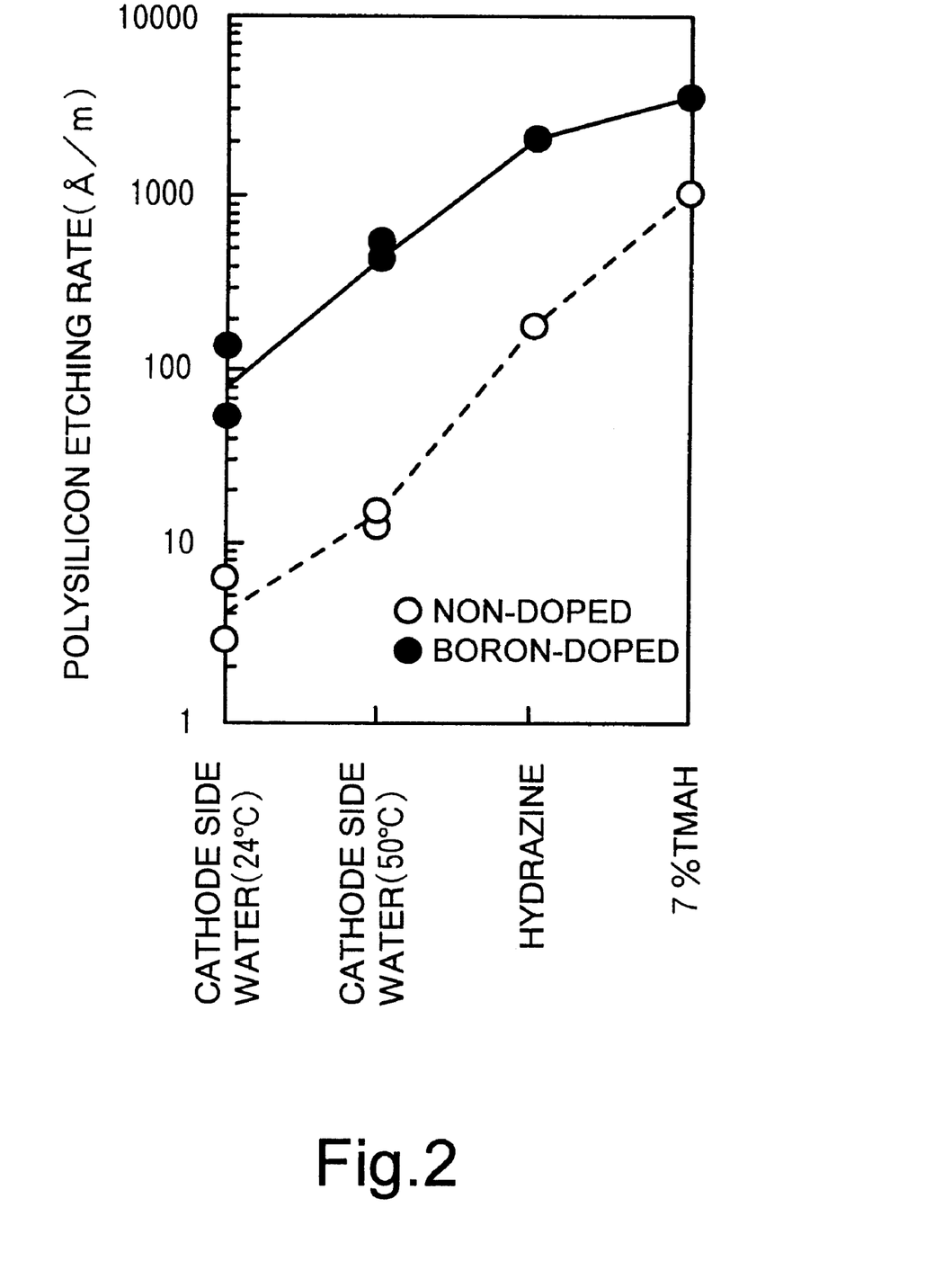
FIG. 2 is a graph showing etching rates of doped polysilicon and non-doped polysilicon by respective etching liquids.

A liquid containing pure water added with ammonia such that the concentration of ammonia in the liquid becomes 0.5% was electrolyzed in a similar manner to that in Experiment 1 and the etching rates of a resultant cathode side water for respective non-doped polysilicon and boron-doped polysilicon were measured at room temperature (25° C.) and at 50° C. Results are shown in FIG. 2, together with the etching rates of hydrazine and 7% TMAH solution for comparison purpose.

Figure 3:
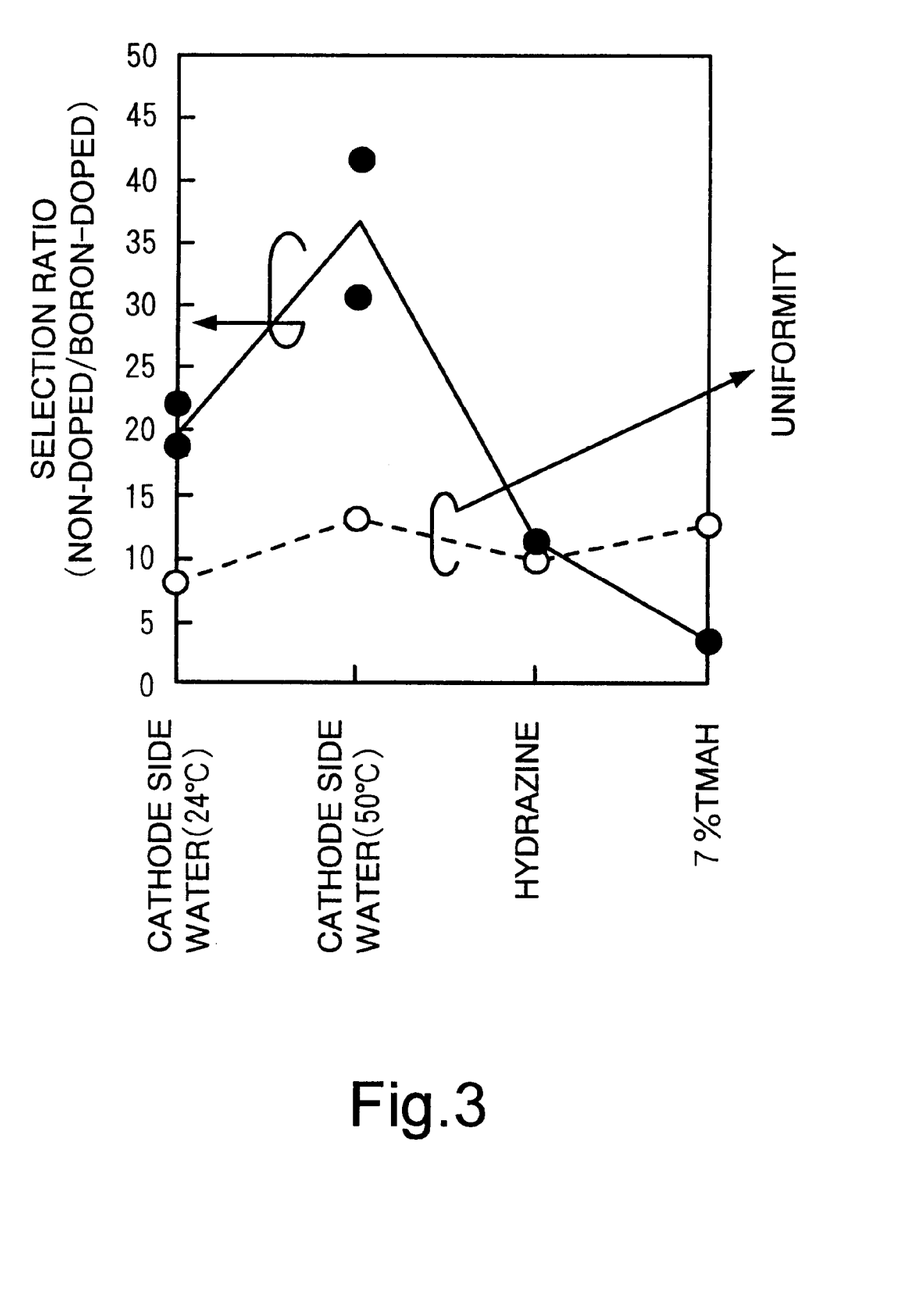
FIG. 3 is a graph showing the etching selection ratio and the uniformity of etching of the respective etching liquids for non-doped polysilicon and doped polysilicon.

FIG. 3 shows the etching selection ratio between non-doped polysilicon and boron-doped polysilicon and the uniformity of etching. Although the etching uniformity for the respective electrolytic liquids are substantially the same, cathode side water used in the present invention is superior in view of the selection ratio, compared with hydrazine.

Figure 1A:
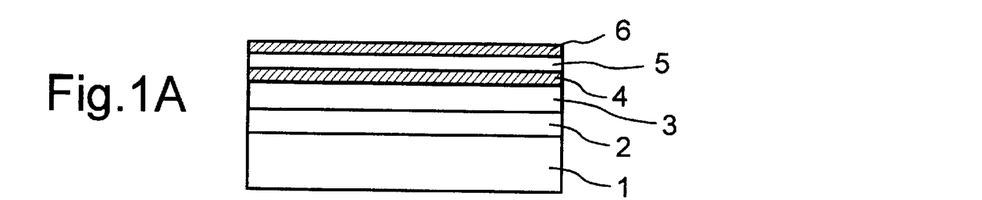
FIGS. 1A to 1G are cross sections of a semiconductor device, showing forming steps of an emitter opening portion of a bipolar transistor.
Figure 1B:
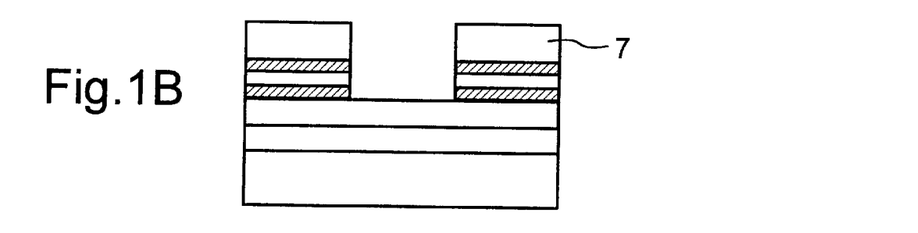
Figure 1C:
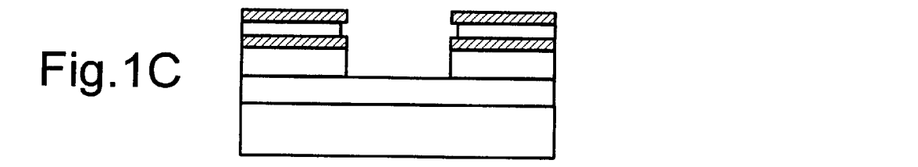
Figure 1D:
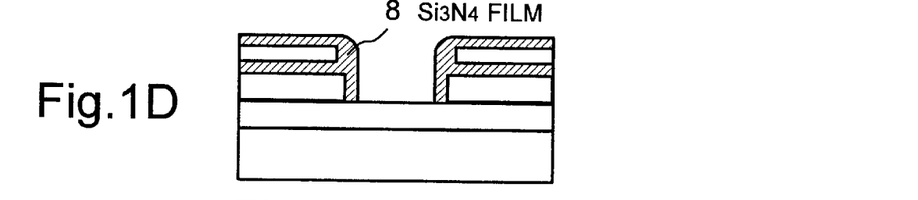
Figure 1E:
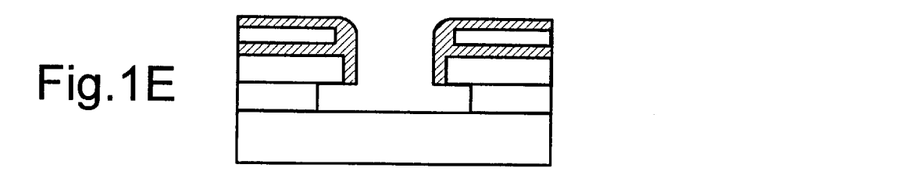
Figure 1F:
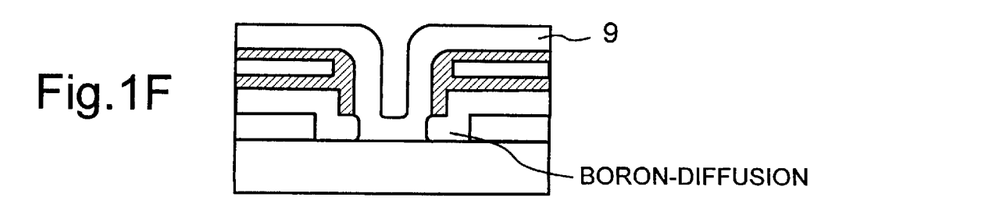
Figure 1G:
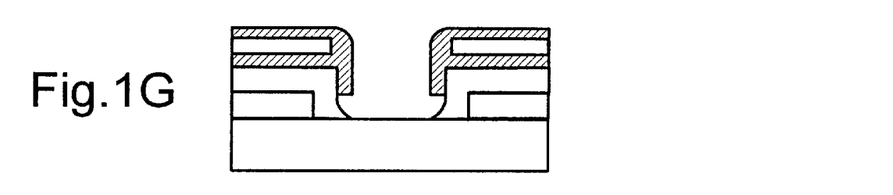

A bipolar transistor was fabricated along the steps shown in FIGS. 1A to 1G. Referring to FIG. 1A, a $SiO_2$ film 2 is formed on the silicon substrate 1. After a polysilicon film 2300 Å thick is grown on the $SiO_2$ film 2, boron is ion-injected to the polysilicon film with a dose of $5\times10^{19}$ cm$^{-3}$, resulting in a boron doped polysilicon film 3. On the boron-doped polysilicon film 3, a $Si_3N_4$ film 4, a $SiO_2$ film 5 and a $Si_3N_4$ film 6 are formed in the order. Then, in order to form a desired opening portion, a resist is formed on the $Si_3N_4$ film 6 by painting and, after the resist is patterned by exposing and developing it by using lithography, the $Si_3N_4$ film 4, the $SiO_2$ film 5 and the $Si_3N_4$ film 6 formed on the boron-doped polysilicon film 3 are dry-etched by using the patterned resist film as a mask (FIG. 1B). Then, in order to side etch the $SiO_2$ film 5 sandwiched in between the $Si_3N_4$ film 4 and the $Si_3N_4$ film 6, it is wet-etched by using an etching liquid containing hydrofluoric acid etc. Then, the boron-doped polysilicon film 3 is dry-etched (FIG. 1C). Then, a $Si_3N_4$ film 8 is formed on a side wall of the opening portion by growing the $Si_3N_4$ films 4 and 6 and dry-etching it (FIG. 1D). Thereafter, the $SiO_2$ film 2 is wet-etched by using an etching liquid containing hydrofluoric acid, etc., resulting in a configuration such as shown in FIG. 1E. Then, after a non-doped polysilicon film 9 is formed, the non-doped polysilicon film 9 is heat treated at 850 to 900° C. in nitrogen gas atmosphere for 20 minutes to thermally diffuse boron ion from the boron-doped polysilicon film 3 to thereby form a boron diffusion region such as shown in FIG. 1F. Finally, in order to selectively remove the non-doped polysilicon, a polysilicon wet-etching is performed by using a cathode side water (pH=10.8, ORP=−810 mV, temperature 24° C.) obtained on the side of the cathode by electrolyzing pure water added with ammonia having concentration of 0.5% (FIG. 1G). As a result, the boron-doped polysilicon on the emitter opening portion is etched to a configuration having substantially vertical wall.

The bipolar transistor was formed by forming a boron-doped polysilicon film as an emitter in the emitter opening portion after a $Si_3N_4$ film is formed on the side wall of the emitter opening portion.

A good result was obtained in the measurement of breakdown voltage between the emitter and the base of the thus fabricated bipolar translator.

According to the present invention, the etching liquid which can etch the doped polysilicon and the non-doped polysilicon with high selection ratio and does not raise any environmental problem is provided.

It is apparent from the aforementioned specification and the figures that the present invention is not limited to the above embodiments but may be modified and changed without departing from the scope and spirit of the invention.

What is claimed is:

1. A method of removing a non-doped polysilicon comprising:

forming a non-doped polysilicon film; and removing said non-doped polysilicon film by using an etching liquid, said etching liquid being an electrolytic liquid obtained on a side of a cathode electrode, said electrolytic liquid being formed by electrolyzing a liquid containing pure water added with ammonium ion.

2. The method as claimed in claim 1, wherein said electrolytic liquid is used at a temperature in a range from room temperature to 70° C.

3. The method as claimed in claim 1, wherein a concentration of said ammonium ion in said pure water is 10% or less.

4. The method as claimed in claim 1, wherein oxidation-reduction potential of said electrolytic liquid is within a range from −300 mV to −900 mV and pH thereof is within a range from 7.5 to 12.

5. The method as claimed in claim 4, wherein said liquid containing pure water added with ammonium ion is formed by adding aqua ammonia to the pure water.

6. A method of forming a semiconductor device having a non-doped polysilicon and a doped polysilicon containing group III element as impurity, comprising:

selectively etching said non-doped polysilicon by using an etching liquid;

wherein said etching liquid is an electrolytic liquid obtained on a side of a cathode electrode, said electrolytic liquid is formed by electrolyzing a liquid containing pure water added with ammonium ion.

7. The method as claimed in claim 6, wherein said electrolytic liquid is used at a temperature in a range from room temperature to 70° C.

8. The method as claimed in claim 7, wherein a concentration of said ammonium ion in said pure water is 10% or less.

9. The method as claimed in claim 8, wherein oxidation-reduction potential of said electrolytic liquid is within a range from −300 mV to −900 mV and pH thereof is within a range from 7.5 to 12.

10. The method as claimed in claim 9, wherein said liquid containing pure water added with ammonium ion is formed by adding aqua ammonia to the pure water.

11. A method of forming a semiconductor device comprising:

forming a first insulating film on a semiconductor substrate;

forming a first doped-polysilicon film on said first insulating film;

forming a second insulating film on said first doped-polysilicon film;

selectively removing said first doped-polysilicon film and said second insulating film until said first insulating film is exposed to form a first opening having a first diameter;

forming a insulating side wall on a side surface of said first doped-polysilicon film exposed in said first opening;

selectively removing said first insulating film to form a second opening having a second diameter which is larger than that of said first diameter, thereby an bottom surface at an end portion of said doped-polysilicon film is exposed by said second opening;

forming a non-doped polysilicon film in said first opening and said second opening, thereby said non-doped polysilicon film having a first portion which contacts said bottom surface at said end portion of said doped-polysilicon film and said semiconductor substrate and a second portion which is the remaining part of said first portion;

performing a heat treatment to convert said first portion of said non-doped polysilicon film to a second doped polysilicon film;

removing said second portion of said non-doped polysilicon film by using an etching liquid;

wherein said etching liquid is an electrolytic liquid obtained on a side of a cathode electrode, said electrolytic liquid is formed by electrolyzing a liquid containing pure water added with ammonium ion.

12. The method as claimed in claim 11, wherein said electrolytic liquid is used at a temperature in a range from room temperature to 70° C.

13. The method as claimed in claim 12, wherein a concentration of said ammonium ion in said pure water is 10% or less.

14. The method as claimed in claim 13, wherein oxidation-reduction potential of said electrolytic liquid is within a range from −300 mV to −900 mV and pH thereof is within a range from 7.5 to 12.

15. The method as claimed in claim 14, wherein said liquid containing pure water added with ammonium ion is formed by adding aqua ammonia to the pure water.

* * * * *